United States Patent
Datta et al.

(10) Patent No.: US 6,740,427 B2
(45) Date of Patent: May 25, 2004

(54) THERMO-MECHANICALLY ROBUST C4 BALL-LIMITING METALLURGY TO PREVENT FAILURE DUE TO DIE-PACKAGE INTERACTION AND METHOD OF MAKING SAME

(75) Inventors: Madhav Datta, Portland, OR (US); Dave Emory, Aloha, OR (US); Tzeun-luh Huang, Portland, OR (US); Subhash M. Joshi, Beaverton, OR (US); Christine A. King, Gilbert, AZ (US); Zhiyong Ma, Beaverton, OR (US); Thomas Marieb, Portland, OR (US); Michael Mckeag, Aloha, OR (US); Doowon Suh, Warren, OR (US); Simon Yang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/961,037

(22) Filed: Sep. 21, 2001

(65) Prior Publication Data
US 2003/0059644 A1 Mar. 27, 2003

(51) Int. Cl.⁷ .................. B32B 15/01; C25D 5/10
(52) U.S. Cl. .............. 428/660; 428/645; 428/646; 428/651; 428/661; 438/614
(58) Field of Search ............... 428/660, 645, 428/646, 651, 661; 438/614

(56) References Cited

U.S. PATENT DOCUMENTS

| 3,663,184 | A | * | 5/1972 | Wood et al. ............ 428/620 |
| 4,290,079 | A | | 9/1981 | Carpenter et al. ......... 357/71 |
| 4,360,142 | A | | 11/1982 | Carpenter et al. ........ 228/123 |
| 4,505,029 | A | * | 3/1985 | Owyang et al. ......... 438/121 |
| 4,880,708 | A | | 11/1989 | Sharma et al. .......... 428/620 |
| 5,137,845 | A | | 8/1992 | Lochon et al. .......... 437/183 |
| 5,376,584 | A | | 12/1994 | Agarwala ............... 437/183 |
| 5,384,283 | A | | 1/1995 | Gegenwarth et al. ..... 437/183 |
| 5,492,235 | A | | 2/1996 | Crafts et al. ............ 216/13 |
| 5,648,686 | A | * | 7/1997 | Hirano et al. ........... 257/778 |
| 5,736,456 | A | * | 4/1998 | Akram .................. 438/614 |
| 5,773,359 | A | * | 6/1998 | Mitchell et al. ......... 438/614 |
| 5,885,891 | A | * | 3/1999 | Miyata et al. .......... 438/612 |
| 5,903,058 | A | | 5/1999 | Akram .................. 257/778 |
| 6,111,321 | A | | 8/2000 | Agarwala ............... 257/772 |
| 6,130,170 | A | | 10/2000 | David et al. ............ 438/745 |
| 6,222,279 | B1 | * | 4/2001 | Mis et al. ............... 257/779 |
| 6,224,690 | B1 | * | 5/2001 | Andricacos et al. ....... 148/400 |
| 6,232,212 | B1 | * | 5/2001 | Degani et al. .......... 438/612 |
| 6,313,651 | B1 | | 11/2001 | Hembree et al. ......... 324/755 |
| 6,348,730 | B1 | | 2/2002 | Yi et al. ................ 257/737 |
| 6,387,793 | B1 | * | 5/2002 | Yap et al. .............. 438/612 |
| 6,426,282 | B1 | * | 7/2002 | Saigal et al. ........... 438/613 |
| 6,489,229 | B1 | * | 12/2002 | Sheridan et al. ......... 438/614 |
| 6,495,449 | B1 | | 12/2002 | Nguyen ................. 438/627 |

FOREIGN PATENT DOCUMENTS

JP         2001189334         7/2001     ......... H01L/21/60

OTHER PUBLICATIONS

"Chromium Copper Step Phasing", *IBM Technical Disclosure Bulletin*, (Aug. 1, 1977), pp. 1005–1006.

(List continued on next page.)

Primary Examiner—John J. Zimmerman
Assistant Examiner—Jason L Savage
(74) Attorney, Agent, or Firm—Blakely, Sokoloff, Taylor & Zafman LLP

(57) ABSTRACT

The invention relates to a ball limiting metallurgy stack for an electrical device that contains a tin diffusion barrier and thermo-mechanical buffer layer disposed upon a refractory metal first layer. The multi-diffusion barrier layer stack resists tin migration toward the upper metallization of the device.

25 Claims, 7 Drawing Sheets

OTHER PUBLICATIONS

Tummala, Rao, et al., "Microelectronics Packaging Handbook, Semiconductor Packaging", *Part 2, 2nd Edition*, (1997), pp. 132–139 No Month.

Annala, P., et al., "Electroplated Solder Alloys for Flip Chip Interconnections", *Physica Scripta, T69*, pp. 115–118, (1997) No Month.

Datta, M., et al., "Electrochemical Fabrication of Mechanically Robust PbSn C4 Interconnections", *Journal of the Electrochemical Society*, 142 (11), 7 p., (Nov. 1995).

Honma, S., et al., "Effectiveness of Thin–film Barrier Metals for Eutectic Solder Bumps", *Microelectronics International*, 14 (3), pp. 47–50, (Sep. 1997).

Liu, C.Y., et al., "Electron microscopy study of interfacial reaction between eutectic SnPb and Cu/Ni(V)/Al thin film metallization", *Journal of Applied Physics*, 86 (11), pp. 1–5, (Dec. 1999).

* cited by examiner

US 6,740,427 B2

THERMO-MECHANICALLY ROBUST C4 BALL-LIMITING METALLURGY TO PREVENT FAILURE DUE TO DIE-PACKAGE INTERACTION AND METHOD OF MAKING SAME

FIELD OF THE INVENTION

An embodiment of the present invention relates generally to integrated circuit fabrication. More particularly, an embodiment of the present invention relates to electrical connection technology. In particular, an embodiment of the present invention relates to a ball-limiting metallurgy comprising a tin diffusion barrier layer.

BACKGROUND OF THE INVENTION

Description of Related Art

Electrical bump connectors such as metal bumps or balls are used in flip-chip (C4) applications. As the progress of miniaturization continues, the sizes of individual metal grains at the junction between a microelectronic device metallization and the electrical bump become increasingly large relative to the mass of the electrical bump. Consequently, junction disparities have an increasingly detrimental effect on electrical communication between the device and the electrical bump. One junction disparity relates to migration of bump metals through the metal layer that is disposed over the metallurgy. Another consequence of miniaturization is stress that builds up in the ball-limiting metallurgy due to the formation of intermetallic pockets between the metallization and the electrical bump.

BRIEF DESCRIPTION OF THE DRAWINGS

In order that the manner in which embodiments of the present invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

An embodiment of the present invention relates to a ball-limiting metallurgy (BLM) stack that facilitates miniaturization, that resists tin migration from the metal bump into the metallization, and that resists electrical discontinuities between metallization and metal bumps. In one embodiment, a metal first layer is disposed above and on the metallization. A metal second layer is disposed above and on the metal first layer, and a metal upper layer is disposed over the metal second layer. The metal second layer is selected from aluminum (Al), doped or undoped titanium (Ti), Ti-tungsten (TiW), hafnium (Hf), and zirconium (Zr). The metal second layer has utility as a tin diffusion barrier and thermo-mechanical buffer layer. The metal upper layer is a non-ferroelectrics metal alloy or doped metal. An electrically conductive bump is disposed above and on the metal upper layer.

In another embodiment, a metal first layer is disposed above and on the metallization. A metal second layer is disposed above and on the metal first layer. A metal third layer that is the same composition as the metal first layer, is disposed above and on the metal second layer. The metal upper layer is disposed above and on the metal third layer. The metal upper layer is a non-ferroelectrics metal alloy or doped metal. An electrically conductive bump is disposed above and on the metal upper layer.

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientations.

Reference will now be made to the drawings wherein like structures will be provided with like reference designations. In order to show the structures of embodiments of the present invention most clearly, the drawings included herein are diagrammatic representations of integrated circuit structures. Thus, the actual appearance of the fabricated structures, for example in a photomicrograph, may appear different while still incorporating the essential structures of embodiments of the present invention. Moreover, the drawings show only the structures necessary to understand embodiments of the present invention. Additional structures known in the art have not been included to maintain the clarity of the drawings.

Figure 1:
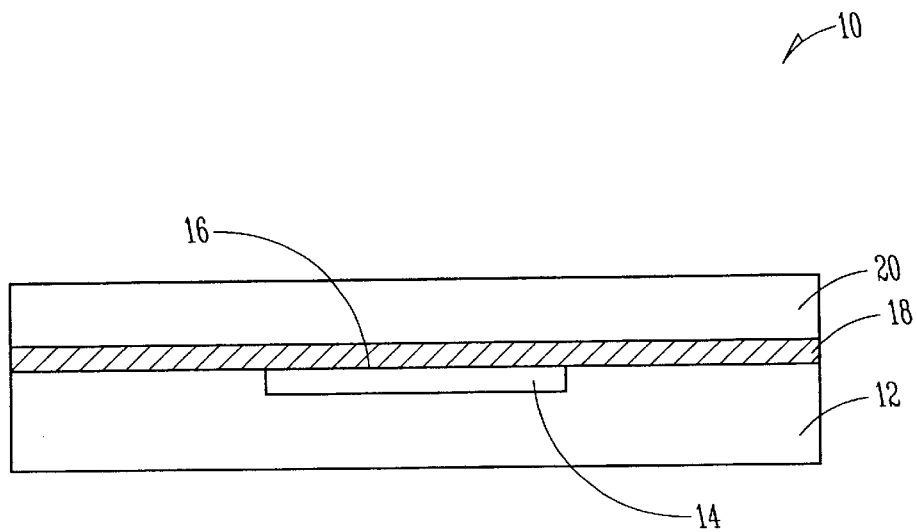
FIG. 1 is an elevational cross-section of a semiconductor structure that reveals metallization.

FIG. 1 is a cross-section of a semiconductor structure 10 during fabrication that includes a substrate 12 and a metallization 14 such as a copper pad that makes connection to what is commonly referred to as metal six (M6) by way of non-limiting example. Metallization 14 may be disposed with an upper surface 16 that is coplanar with substrate 12 where substrate 12 may be an interlayer dielectric (ILD) composition. A nitride layer 18 and a passivation layer 20 are formed over substrate 12 and metallization 14. Nitride layer 18 and passivation layer 20 act to protect substrate 12 and to expose metallization 14 according to the patterning. Passivation layer 20 may be a polyimide material or it may be an inorganic material such as a silicon oxide that is formed by the decomposition of tetraethyl ortho silicate (TEOS). Patterning is accomplished by a first mask (not pictured) that exposes passivation layer 20 through a recess 22 during an etch process.

Figure 2:
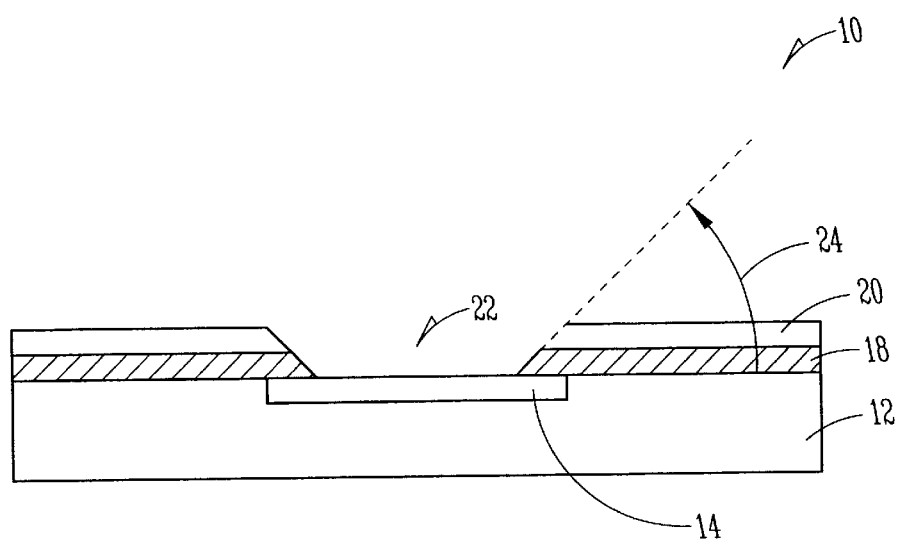
FIG. 2 is an elevational cross-section of the semiconductor structure depicted in FIG. 1 after patterning of a passivation layer.

FIG. 2 illustrates a patterned passivation structure, that includes portions of former nitride layer 18 and passivation layer 20, and that exposes a portion of metallization 14. The process may be carried out by blanket forming nitride layer 18 and passivation layer 20, patterning, etching recess 22, and curing passivation layer 20 where passivation layer 20 is a polyimide. In one embodiment after the cure, passivation layer 20 has formed a slope 24 that has an angle, in a range from about 30° to about 60°. In one embodiment after the cure, passivation layer 20 has formed slope 24 that is about 45°.

Figure 3:
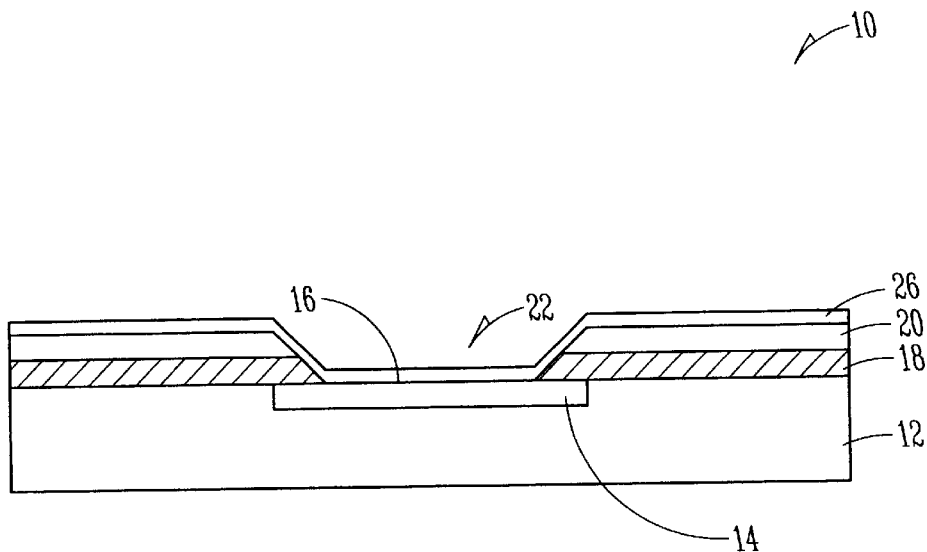
FIG. 3 is an elevational cross-section of the semiconductor structure depicted in FIG. 2 after further processing.

FIG. 3 illustrates further processing that is carried out where patterned passivation layer 20 and metallization 14 are covered with a metal first layer 26. In one embodiment, metal first layer 26 is a refractory metal such as titanium, zirconium, hafnium, and the like. Other refractory metals for metal first layer 26 include nickel, cobalt, palladium, platinum, and the like. Other refractory metals for metal first layer 26 include chromium, molybdenum, tungsten, and the like. Other refractory metals for metal first layer 26 include scandium, yttrium, lanthanum, cerium, and the like. One preferred property embodiment is a metal first layer 26 that exhibits sufficient adhesion to the metallization that liftoff or spalling thereof will not occur during fabrication, test, and ordinary field use.

In one embodiment, metal first layer 26 is titanium that is formed by physical vapor deposition (PVD) to a thickness in a range from about 500 Å to about 2,000 Å, and preferably about 1,000 Å. In another embodiment, metal first layer 26 is chromium that is formed by PVD to a thickness in a range from about 500 Å to about 2,000 Å, and preferably about 1,000 Å.

Figure 4:
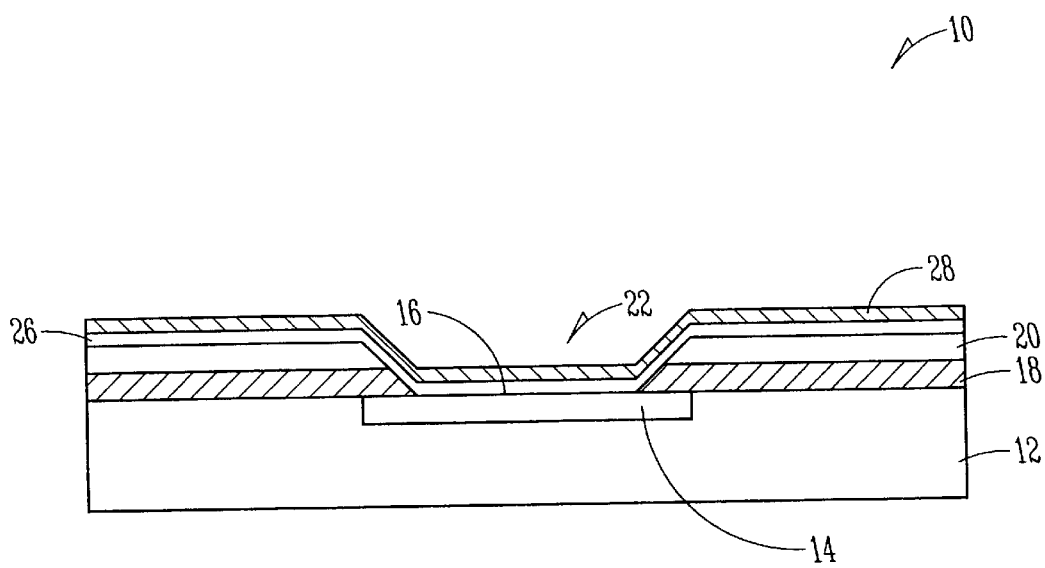
FIG. 4 is an elevational cross-section of the semiconductor structure depicted in FIG. 3 after further processing.

FIG. 4 illustrates further processing in which metal first layer 26 is covered with a metal second layer 28. Metal second layer 28 is formed by PVD according to known technique. In one embodiment, metal second layer 28 has a thickness in a range from about 500 Å to about 4,000 Å. In one embodiment, metal second layer 28 has a thickness in a range from about 750 Å to about 2,000 Å. In one embodiment, metal second layer 28 has a thickness of about 1,000 Å. In one embodiment, metal second layer 28 is Al and the like. In another embodiment, metal second layer 28 is selected from Ti, doped Ti, TiW, and the like. In another embodiment, metal second layer 28 is selected from Zr, Hf, and the like. Metal second layer acts as a tin diffusion barrier and thermo-mechanical buffer layer.

Figure 5:
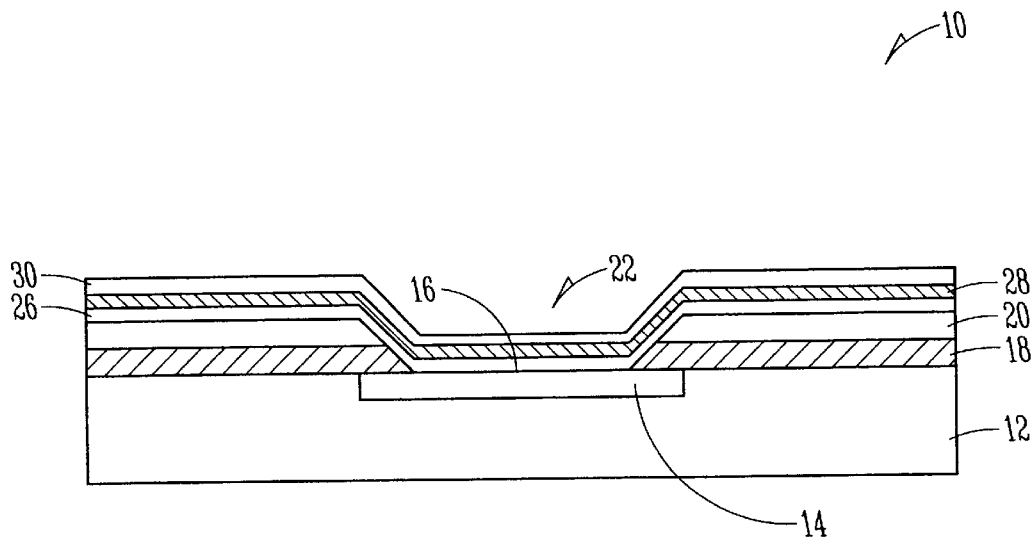
FIG. 5 is an elevational cross-section of the semiconductor structure depicted in FIG. 4 after further processing.

FIG. 5 illustrates further processing in which a refractory metal upper layer 30 is formed over metal second layer 28. In one embodiment, refractory metal upper layer 30 is a refractory metal, a refractory metal alloy, or a doped refractory metal. The refractory metal alloy or the doped metal is in stoichiometric or solid solution ratios. In one embodiment, refractory metal upper layer 30 is a vanadium-alloyed or vanadium-doped metal of at least one metal selected from nickel, cobalt, palladium, platinum, and the like. The vanadium may be added where the refractory metal may be ferroelectric. In one embodiment, refractory metal upper layer 30 is a metal, a vanadium-alloyed, or vanadium-doped metal of at least one selected from titanium, zirconium, hafnium, and the like. In another embodiment, refractory metal upper layer 30 is a metal, a vanadium-alloyed, or vanadium-doped metal of at least one selected from chromium, molybdenum, tungsten, and the like. In another embodiment, refractory metal upper layer 30 is a metal, a vanadium-alloyed, or vanadium-doped metal of at least one selected from scandium, yttrium, lanthanum, cerium, and the like.

In one embodiment, refractory metal upper layer 30 is a refractory metal, a refractory metal-vanadium alloy, or vanadium-doped metal that is formed by PVD to a thickness in a range from about 1,000 Å to about 4,000 Å, and preferably about 2,000 Å. In one embodiment, refractory metal upper layer 30 is a NiV alloy. In another embodiment, refractory metal upper layer 30 is a vanadium-doped nickel layer.

Although sputtering of the three metal layers 26–30 is a process flow embodiment, evaporation deposition of a composition such as an organometallic material is also used as a process flow embodiment as known in the art.

In an alternative embodiment, refractory metal upper layer 30, is nitrided to form a nitrided metal alloy or a nitrided vanadium-doped metal as set forth herein. Nitriding conditions may be carried out according to known technique for nitridation of metals. In selected embodiments, refractory metal upper layer 30 is a nitrided refractory metal-vanadium alloy or a nitrided, vanadium-doped refractory metal. In other selected embodiments, refractory metal upper layer 30 is a nitrided NiV alloy or a nitrided vanadium-doped nickel metal.

Following the formation of the three metal layers 26–30 as set forth herein, processing continues by plating a bump precursor over the three-metal-layer stack. Plating may be electroless plating or electroplating as is known in the art.

Figure 6:
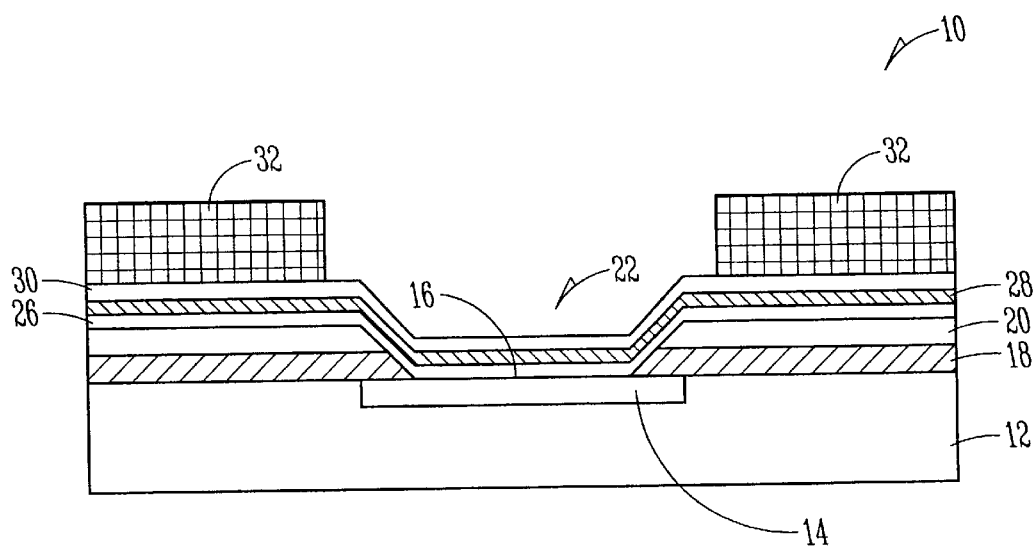
FIG. 6 is an elevational cross-section of the semiconductor structure depicted in FIG. 5 after further processing.

FIG. 6 illustrates further processing in which a second mask 32 is patterned to expose refractory metal upper layer 30 where the exposure is substantially centered over metallization 14. Second mask 32 is peripherally patterned because a plating process is carried out to plate a bump precursor that adheres to refractory metal upper layer 30.

Figure 7:
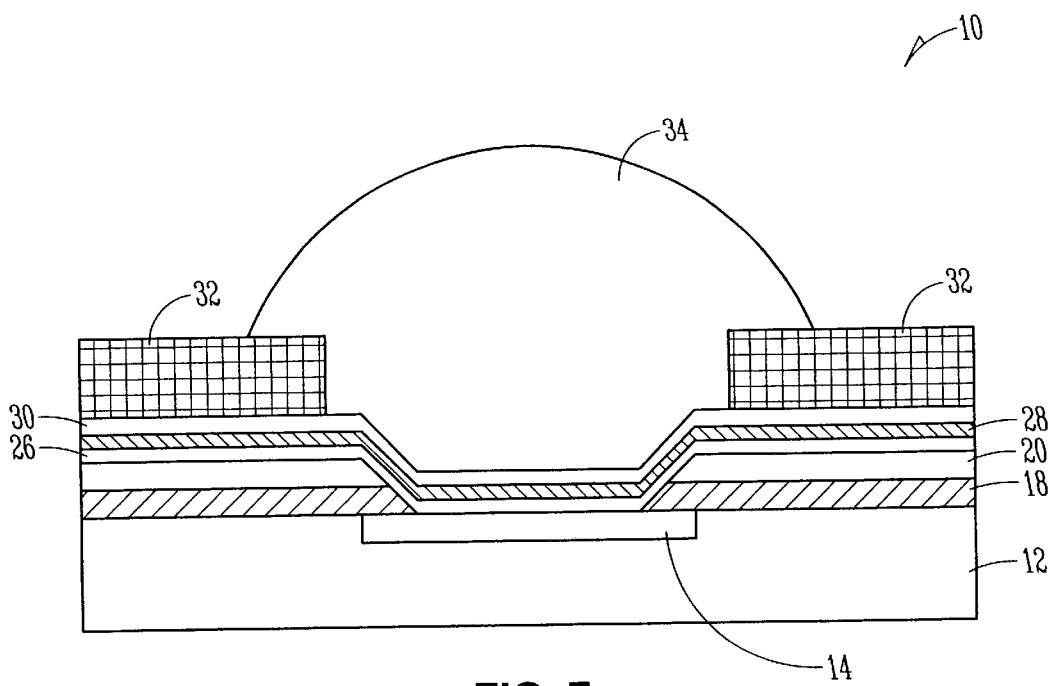
FIG. 7 is an elevational cross-section of the semiconductor structure depicted in FIG. 6 after further processing.

FIG. 7 illustrates further processing in which a bump precursor button 34 has been plated over refractory metal upper layer 30 through second mask 32. Plating is carried out by electroless plating techniques or by electroplating techniques as is known in the art. By way of non-limiting example, electroplating is carried out to form bump precursor button 34 as a discrete structure that is spaced-apart from any closest neighboring bump precursors. Accordingly, bump precursor button 34 may have a curvilinear perimeter (not pictured) and a curvilinear vertical profile. Alternatively, a plating film may be formed and subsequently patterned into substantially discrete bump precursor structures by a process such as an etch. Accordingly, the bump precursor structure may have a rectilinear perimeter (not pictured) and a rectilinear vertical profile (also not pictured). In any event, bump precursor button 34 or a patterned bump precursor structure (not depicted) may be selected from a solder composition that facilitates embodiments.

In one embodiment, bump precursor button 34 is a tin-lead solder. In selected embodiments, bump precursor button 34 is a tin-lead solder composition such as from Sn97Pb. A tin-lead solder composition that may be used with a substrate that is to be flip-chip mounted over semiconductor structure 10 is a Sn37Pb composition. In any event, bump precursor button 34 may be a tin-lead solder comprising $Sn_xPb_y$, wherein x+y total 1, and wherein x is in a range from about 0.3 to about 0.99. Preferably, the bump precursor button 34 is a tin-lead solder composition of Sn97Pb, and substrate solder for forming the C4 bond is a tin-lead solder composition of Sn37Pb.

Figure 8:
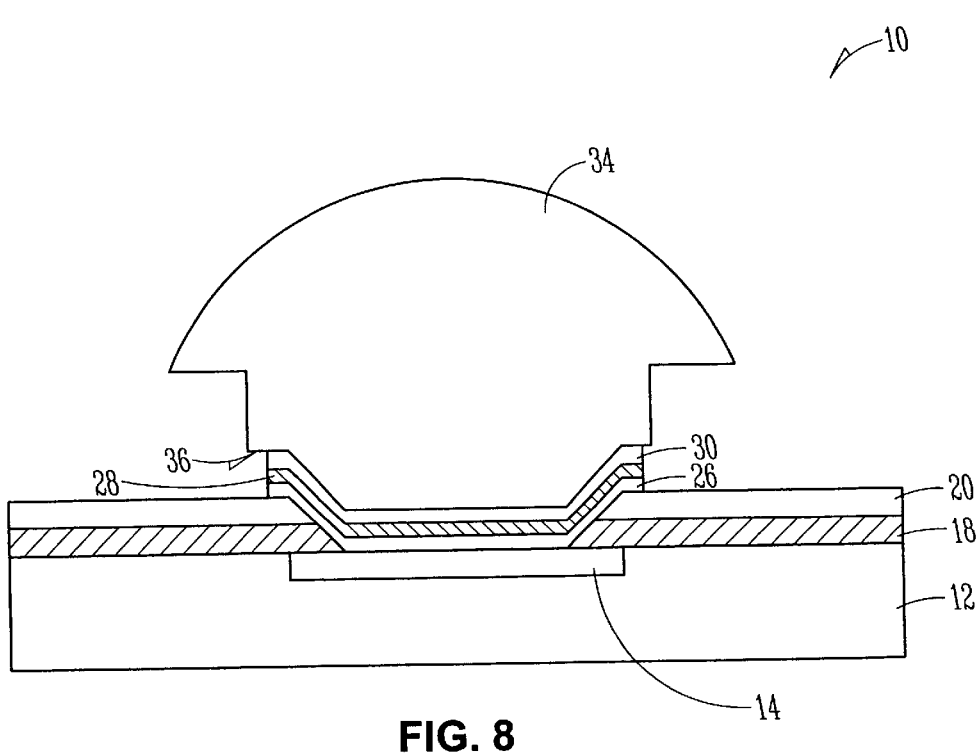
FIG. 8 is an elevational cross-section of the semiconductor structure depicted in FIG. 7 after further processing.

FIG. 8 illustrates further processing in which the three metal layers 26–30 are removed substantially everywhere except directly under bump precursor button 34. Second mask 32 may be simultaneously removed with portions of the three metal layers 26–30, or it may be preliminarily removed such as by wet stripping or by ashing. Removal of lateral portions of the three metal layers 26–30 may be carried out by a wet etch that is substantially selective to the electrically conductive bump precursor button 34, and to patterned passivation layer 24. Although some undercutting 36 into the three metal layers 26–30 beneath bump precursor button 34 may be desirable, it may be balanced against risking a total slumping of the solder during reflow. In one embodiment, undercutting 36 may be in a range from about 0.5 micrometers (microns) to about 6 microns, preferably about 3 microns.

Figure 9:
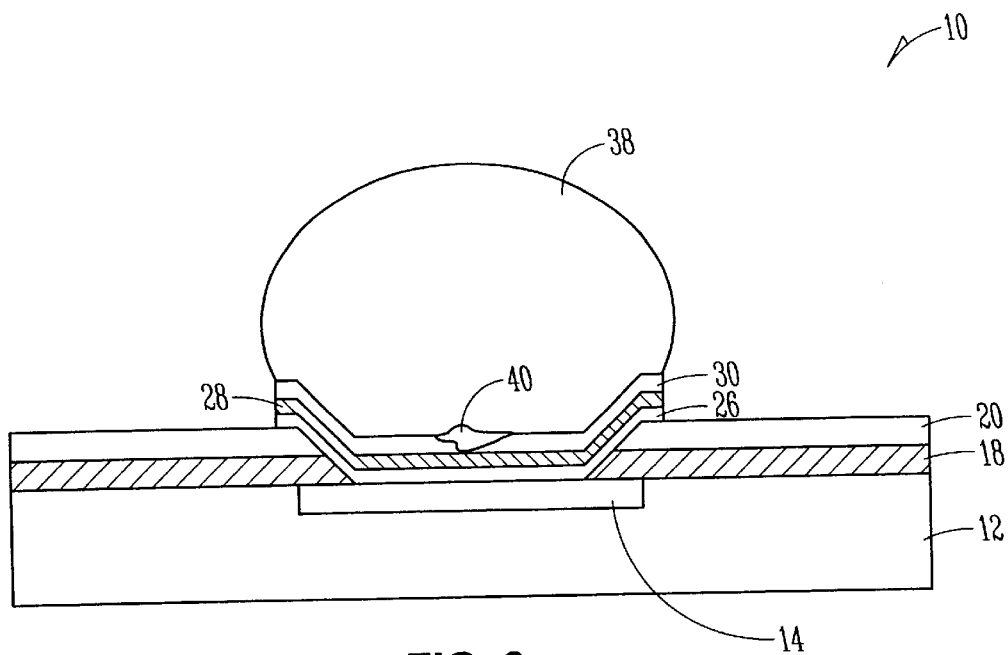
FIG. 9 is an elevational cross-section of the semiconductor structure depicted in FIG. 8 after further processing.

FIG. 9 illustrates further processing in which the bump precursor button 34 has been reflowed into a solder ball 38 that has been dimensionally limited by the metallurgy of the metal layers 26–30 and by the degree of undercutting as set forth herein. Hence the BLM of an embodiment may cause sufficient wetting of solder ball 38 onto refractory metal upper layer 30 to form a solder ball 38 that has a preferred shape and height. In selected embodiments, the vertically measured diameter of solder ball 38 may be in a range from about 50 micrometers (microns) to about 200 microns. In another embodiment, the major vertical dimension of bump precursor button 34 is about 57 microns before it is reflowed, and it is about 100 microns after it is reflowed.

The eccentricity (the vertical diameter divided by the horizontal diameter) of solder ball 38 may be in a range from about 0.5 to about 1.2. A lower eccentricity may be preferred where the pitch of a given ball array would lead to a bridging problem between neighboring balls during reflow or during reflow flip-chip mounting. Eccentricity may be controlled by solder ball amount and solder ball wetting properties in relation to refractory metal upper layer 30.

Because some intermetallic material may form between the solder ball 38 and metallization 14, the metal layers 26–30 act to prevent excessive intermetallic formation, and to resist tin migration toward metallization 14. FIG. 9 illustrates an intermetallic zone 40, in an arbitrary shape and size, that may form under ordinary processing conditions according to an embodiment. Where the metallurgy of solder ball 38 is $Sn_xNi_y$ or the like, a nickel-tin intermetallic zone 40 may form that may be restricted by the BLM configuration according to embodiments set forth herein.

In one embodiment, certain thicknesses of the layers 26–30 are preferred to control formation of intermetallic material. The metal layers should not be too thin individually so that the BLM stack is consumed. Otherwise, during the temperature cycling, once the BLM stack is consumed, the intermetallic that forms, segregates and form shapes that may move upward into the solder. Consequently, volume changes that correspond with intermetallic formation may cause significant stress in the electrical structure. In one embodiment, the aluminum metal second layer 28 significantly resists combination of stack metals with tin in the tin-lead solder. Consequently, where significant consumption of refractory metal upper layer 30 may occur, aluminum metal second layer 28 acts as a migration stop to tin in solder ball 38.

Figure 10:
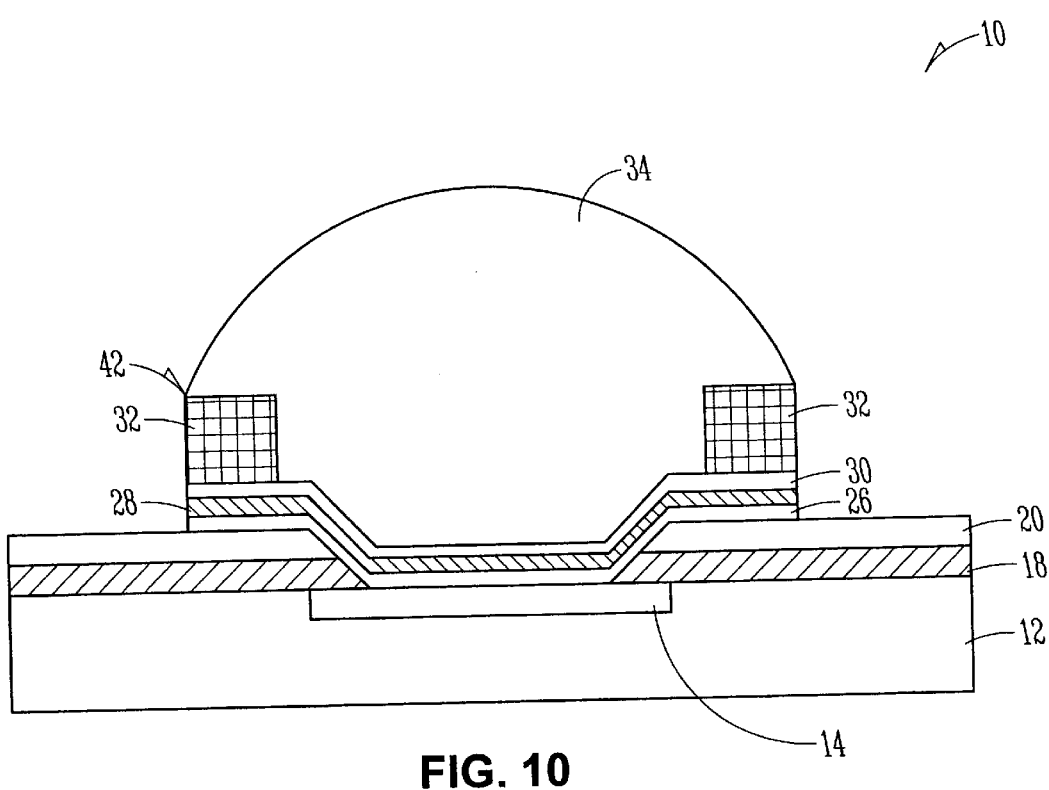
FIG. 10 is an elevational cross-section of the semiconductor structure depicted in FIG. 7 after further processing according to an alternative process flow.

In one embodiment, processing of undercut 36 is controlled by specific etch conditions for removal of the metal layers 26–30. By way of non-limiting example, second mask 32 is removed by any means such as wet stripping or ashing, and a multi-process etch is carried out to remove lateral portions of the three metal layers 26–30 as depicted in FIG. 10. In a first process, an anisotropic etch is carried out where bump precursor button 34, out to the tip 42 thereof, acts as a shadow mask. FIG. 10 illustrates shadow mask etching wherein second mask 32 is removed except where it is shadow-protected by tip 42 of bump precursor button 34. Similarly, removal of the metal layers 28–30 has occurred except where bump precursor button 34 acts as a shadow mask. Next, second mask 32 is wet stripped. Thereafter, a wet etch is carried out to remove excess metal layer material to achieve a structure similar to what is depicted in FIG. 8. Alternatively, the wet etch recipe is configured to simultaneously remove second mask 32.

Figure 11:
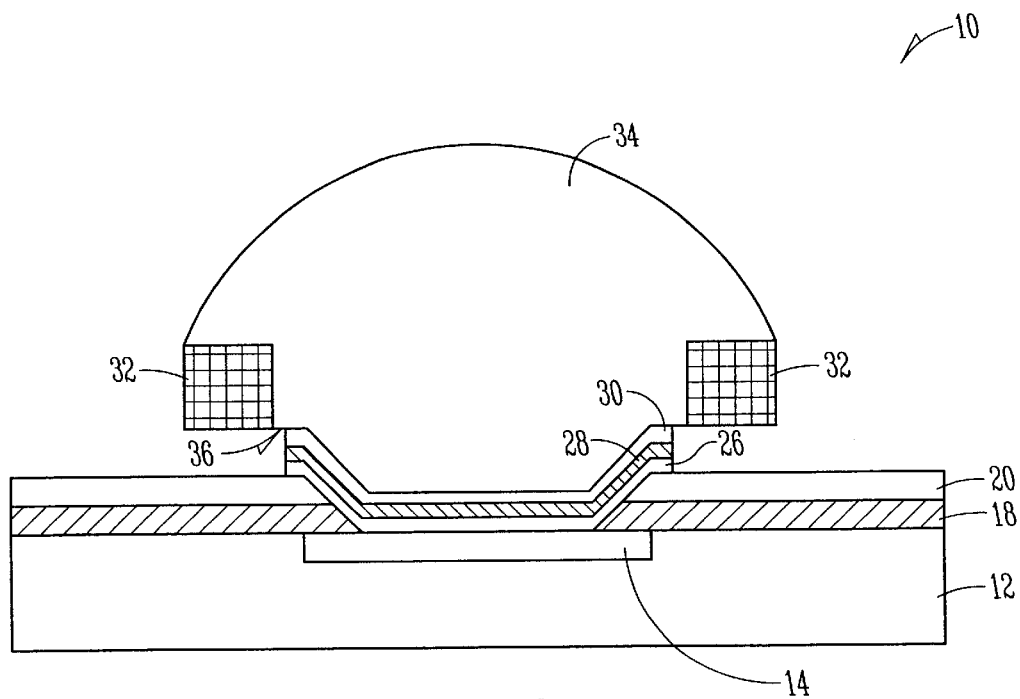
FIG. 11 is an elevational cross-section of the semiconductor structure depicted in FIG. 10 after further processing.

In a third alternative, processing is carried out similar to what is depicted as being processed in FIG. 11. After the anisotropic etch of some of second mask 34 and some of the metal layers 26–30 is completed as depicted in FIG. 10, an isotropic wet etch is carried out. The isotropic wet etch laterally etches the metal layers 26–30 to form metal layers 26–30 similar to what is depicted in FIG. 8. The etch recipe is selective to various structures including passivation layer 20, what is left of second mask 34 by the shadow-mask effect of bump precursor button 36, and bump precursor button 36 itself. Thereafter, wet stripping, ashing, or another removal technique known in the art is carried out to remove what is left of second mask 32. Thereby, undercutting 36 of the metal layers 26–30 is controlled by the presence of what is left of second mask 32 and excessive undercutting 36 into refractory metal upper layer 30 is resisted.

The following is a process example that relates to semiconductor structure 10 as depicted in FIGS. 1–11. A substrate 12 containing an M6 metallization and a metallization 14 bond pad is provided. Substrate 12 contains a silicon oxide ILD material as is known in the art. A nitride layer 18 and a passivation layer 20 are formed over substrate 12 and metallization 14. Passivation layer 20 is a polyimide layer that is formed according to known technique. Thereafter, a photoresist first mask (not pictured) is spun on and patterned to expose a recess 22. Etching of passivation layer 20 is carried out in a dry etch. Thereafter, passivation layer 20 is cured such it shrinks in vertical dimension, and forms an angle 24 of about 45°. A metal first layer 26 is formed by PVD of Ti over substrate 12 and structures supported thereon. Metal first layer 26 is about 1,000 Å thick in the vertical dimension as depicted in FIG. 3. Next, a metal second layer 28 is formed by PVD over metal first layer 26. Metal second layer 28 is about 1,000 Å. A refractory metal upper layer 30 is formed by PVD of a NiV alloy over metal second layer 28. Refractory metal upper layer 30 is about 2,000 Å. Nitriding of refractory metal upper layer 30 is carried under thermal processing conditions according to known technique.

After the formation of the three metal layers 26–30, a photoresist second mask 32 is spun on, cured, exposed, and patterned according to known technique. Patterning of second mask 32 exposes refractory metal upper layer 30 directly above metallization 14. Thereafter, an electroplating solution that has tin and lead in a Sn97Pb proportion is applied over substrate 12 until a bump precursor button 34 has been formed. Next, an anisotropic etch is carried out by the shadow mask technique that removes portions of second mask 32 and that stops on refractory metal upper layer 30. A follow-up anisotropic etch is carried out that removes lateral portions of the three metal layers according to the shadow-mask technique set forth herein. Finally, a wet third etch is carried out that undercuts 36 the remaining portions of second mask 32 until a preferred dimension of a BLM stack of the three metal layers 26–30 remains. Second mask 32 is removed by a wet stripping process. Thereafter, a thermal process acts that reflows bump precursor button 34 to form a solder ball 38.

Figure 12:
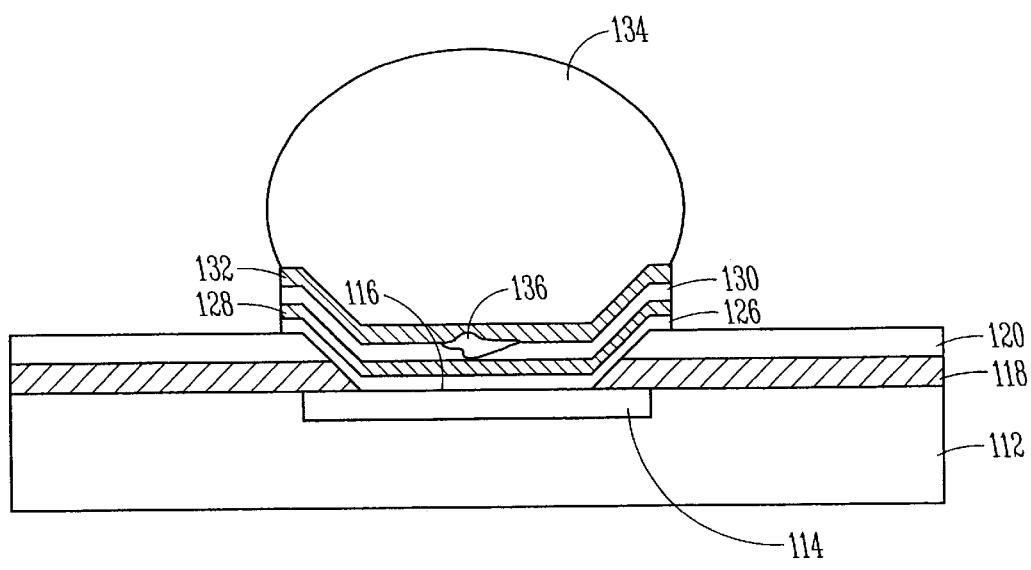
FIG. 12 is an elevational cross-section of an alternative semiconductor structure embodiment.

FIG. 12 is another embodiment of the present invention. Similar to fabrication of semiconductor structure 10 depicted in FIGS. 1–9, a semiconductor structure 110 is formed with a refractory metal third layer.

Semiconductor structure 110 includes a substrate 112 and a metallization 114 such as a copper pad that makes connection to an M6 by way of non-limiting example. Metallization 114 may be disposed with an upper surface 116 that is coplanar with substrate 112 where substrate 112 may be an interlayer dielectric (ILD) composition. A nitride layer 118 and a passivation layer 120 are formed over substrate 112 and metallization 114. A metal first layer 126 is disposed over patterned passivation layer 124 and metallization 114. In one embodiment, metal first layer 126 is a refractory metal such as titanium, zirconium, hafnium, and the like. In one embodiment, metal first layer 126 includes nickel, cobalt, palladium, platinum, and the like. In one embodiment, metal first layer 126 includes chromium, molybdenum, tungsten, and the like. In one embodiment, metal first layer 126 includes scandium, yttrium, lanthanum, cerium, and the like. One property embodiment is a metal first layer that exhibits sufficient adhesion to the metallization that liftoff or spalling thereof will not occur during fabrication, test, and ordinary field use.

In one embodiment, metal first layer 126 is titanium that is formed by PVD to a thickness in a range from about 500 Å to about 2,000 Å. In one embodiment, metal first layer is about 1,000 Å. In another embodiment, metal first layer 126 is chromium that is formed by PVD to a thickness in a range from about 500 Å to about 2,000 Å. In one embodiment, metal first layer is chromium that is about 1,000 Å.

Metal first layer 126 is covered with a metal second layer 128. Metal second layer 128 is formed by PVD according to known technique. In one embodiment, metal second layer 128 has a thickness in a range from about 500 Å to about 4,000 Å. In one embodiment, metal second layer 128 has a thickness in a range from about 750 Å to about 2,000 Å. In one embodiment, metal second layer 128 has a thickness of about 1,000 Å.

Metal second layer 128 is covered with a metal third layer 130 that is substantially the same metal as metal first layer 126. In one embodiment, metal third layer 130 is formed by PVD according to known technique. In one embodiment, metal third layer 130 is substantially the same composition as metal first layer 126, within usual process variations. Alternatively, metal third layer 130 is substantially the same metal type as metal first layer 126 according to grouping as set forth herein. Accordingly, "substantially the same metal" or "substantially the same composition" may be referred to as substantially the same metal type according to grouping as set forth herein.

A refractory metal upper layer 132 is formed over metal third layer 130. In one embodiment, refractory metal upper layer 132 is a refractory metal, a refractory metal alloy, or a doped refractory metal. The alloy or the doped metal may be in stoichiometric or solid solution ratios. In one embodiment, refractory metal upper layer 132 is a vanadium-alloyed or vanadium-doped metal of at least one metal selected from nickel, cobalt, palladium, platinum, and the like. The vanadium may be added where the refractory metal may be ferroelectric. In one embodiment, refractory metal upper layer 132 is a metal, a vanadium-alloyed, or vanadium-doped metal of at least one selected from titanium, zirconium, hafnium, and the like. In another embodiment, refractory metal upper layer 132 is a metal, a vanadium-alloyed, or vanadium-doped metal of at least one selected from chromium, molybdenum, tungsten, and the like. In another embodiment, refractory metal upper layer 132 is a metal, a vanadium-alloyed, or vanadium-doped metal of at least one selected from scandium, yttrium, lanthanum, cerium, and the like.

In one embodiment, refractory metal upper layer 132 is a metal, a metal-vanadium alloy, or vanadium-doped nickel metal that is formed by PVD to a thickness in a range from about 1,000 Å to about 4,000 Å, and preferably about 2,000 Å. In one embodiment, refractory metal upper layer 132 is a NiV alloy. In another embodiment, refractory metal upper layer 132 is a vanadium-doped nickel layer.

In one embodiment, metal first and third layers 126, 130 are Ti, and refractory metal upper layer 132 is Ni. Sputtering of the metal layers 126–132 may be carried out under sputtering conditions that will cause them, or one or more of them, to carry a compressive stress that will resist liftoff from patterned passivation layer 124 Such processing conditions are known in the art.

Although sputtering of the metal layers 126–132 may be a preferred embodiment, evaporation deposition of a composition such as an organometallic material may also be used as is known in the art.

In an alternative embodiment, refractory metal upper layer 132, is nitrided to form a nitrided metal alloy or a nitrided vanadium-doped metal as set forth herein. Nitriding conditions may be carried out according to known technique for nitridation of metals. In selected embodiments, refractory metal upper layer 132 is a nitrided refractory metal-vanadium alloy or a nitrided, vanadium-doped refractory metal. In other selected embodiments, refractory metal upper layer 132 is a nitrided NiV alloy or a nitrided vanadium-doped nickel metal.

In another embodiment, metal first and third layers 126, 130, have thicknesses in arbitrary units in a range from about 500 to about 2,000, preferably about 1,000. Similarly, metal second layer 128 has a thickness in arbitrary units in a range from about 500 to about 4,000, preferably from about 750 to about 2,000, and more preferably about 1,000. Further, refractory metal upper layer 132 has a thickness in a range from about 500 to about 4,000, preferably from about 1,000 to about 2,000. As miniaturization technology progresses the ratios of the metal layers may be formed according to these proportionalities.

One metal stack embodiment includes metal first layer 126 of Ti at about 1,000 Å, metal second layer 128 of Al at about 1,000 Å, metal third layer 130 of Ti at about 1,000 Å, and refractory metal upper layer 132 of nitrided NiV at about 4,000 Å. Another metal stack embodiment includes metal first layer 126 of Ti at about 500 Å, metal second layer 128 of Al at about 1,000 Å, metal third layer 130 of Ti at about 500 Å, and refractory metal upper layer 132 of nitrided NiV at about 2,000 Å.

Another metal stack embodiment includes metal first layer 126 of Ti at about 1,000 Å, metal second layer 128 selected from doped Ti, Ti, and TiW at about 1,000 Å, metal third layer 130 of Ti at about 1,000 Å, and refractory metal upper layer 132 of nitrided NiV at about 4,000 Å. Another metal stack embodiment includes metal first layer 126 of Ti at about 500 Å, metal second layer 128 selected from doped Ti, Ti, and TiW at about 1,000 Å, metal third layer 130 of Ti at about 500 Å, and refractory metal upper layer 132 of nitrided NiV at about 2,000 Å.

Another metal stack embodiment includes metal first layer 126 of Ti at about 1,000 Å, metal second layer 128 selected from Zr and Hf at about 1,000 Å, metal third layer 130 of Ti at about 1,000 Å, and refractory metal upper layer 132 of nitrided NiV at about 4,000 Å. Another metal stack embodiment includes metal first layer 126 of Ti at about 500 Å, metal second layer 128 selected from Zr and Hf, and TiW at about 1,000 Å, metal third layer 130 of Ti at about 500 Å, and refractory metal upper layer 132 of nitrided NiV at about 2,000 Å.

Following the formation of the metal layers 126–132 as set forth herein, processing may continue by plating a bump precursor over the four-metal-layer stack similar to semiconductor structure 10 depicted in FIGS. 6–11 according to various process flow embodiments. Further processing as set forth herein may result in a solder ball 134.

Because some intermetallic material may form between the solder ball 134 and metallization 114, the metal layers 126–132 act to prevent excessive intermetallic formation, and to resist tin migration toward metallization 114. FIG. 12 illustrates an intermetallic zone 136, in an arbitrary shape and size, that may form under ordinary processing conditions according to an embodiment as set forth herein.

The following is an example of a process flow embodiment. Reference may be made to FIG. 12. A substrate 112 containing an M6 metallization and a metallization 114 bond pad is provided. Substrate 112 contains a silicon oxide ILD material as is known in the art. A patterned nitride layer 118 and a patterned passivation layer 120 are formed over substrate 112 and metallization 114. Patterned passivation layer 120 is a polyimide layer that is formed according to known technique and as set forth herein.

A metal first layer 126 is formed by PVD of Ti over substrate 112 and structures supported thereon. Metal first layer 126 is about 1,000 Å thick. Next, an aluminum metal second layer 128 is formed by PVD over metal first layer 126. Aluminum metal second layer 128 is about 1,000 Å thick. A metal third layer 130 is formed by PVD of Ti over aluminum metal second layer 128. Metal third layer 130 may be sputtered from the same Ti sputtering target used to form metal first layer 126. Metal third layer 130 is about 1,000 Å thick. Finally as to forming metal layers, a refractory metal upper layer 132 is formed by PVD of a NiV alloy over metal third layer 130. Refractory metal upper layer 132 is about 2,000 Å thick. Nitriding of refractory metal upper layer 132 is next carried out.

After the formation of the four metal layers 126–32, an electroplating solution that has tin and lead in a Sn97Pb proportion is applied over substrate 112 and further processing is carried out that results in a solder ball 134 as set forth herein.

Figure 13:
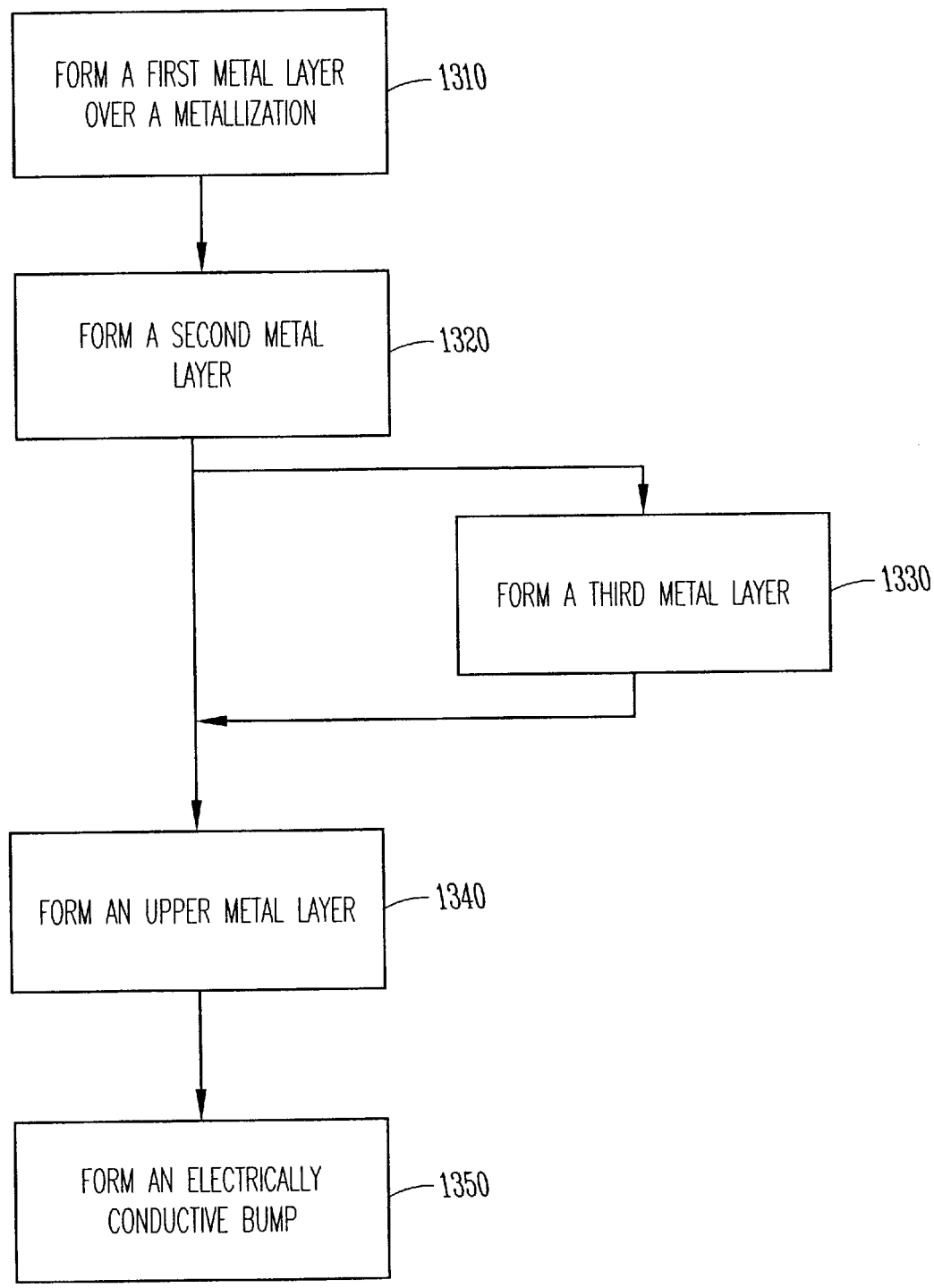
FIG. 13 is a chart that describes a process flow embodiment.

FIG. 13 is a process flow diagram of an embodiment. The process 1300 includes forming 1310 a metal first layer over a metallization as set forth herein. Processing continues by forming 1320 a metal second layer over the metal first layer. According to one embodiment, a metal third layer is formed 1330 over the second metal layer, and the metal third layer is the same metal or type as the metal first layer. In any event, a refractory metal upper layer is formed 1340 over the metal second layer, either above and on it, or above and on the metal third layer. Finally, an electrically conductive bump is formed 1350 as set forth herein.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A ball-limiting metallurgy (BLM) stack comprising:
   a refractory metal first layer disposed above and on a metallization;
   a metal second layer disposed above and on the refractory metal first layer, wherein the metal second layer is selected from Al, doped Ti, Ti, TiW, Hf, and Zr;
   a refractory metal third layer disposed above and on the metal second layer, wherein the refractory metal third layer is substantially the same metal as the refractory metal first layer;
   a refractory metal upper layer disposed over the metal second layer; and
   an electrically conductive bump disposed above and on the refractory metal upper layer.

2. The BLM stack according to claim 1, wherein the refractory metal first layer includes a refractory metal selected from Ni, Co, Pd, Pt, Ti, Zr, Hf, Cr, Mo, W, Sc, Y, La, and Ce.

3. The BLM stack according to claim 1, wherein the refractory metal upper layer is selected from a refractory metal, a metal-doped refractory metal, or a refractory metal alloy.

4. The BLM stack according to claim 1, wherein the refractory metal upper layer is selected from a refractory metal, metal-doped refractory metal, or a refractory metal alloy selected from Ni, Co, Pd, Pt, NiV, CoV, PdV, PtV, Ti, Zr, Hf, Cr, Mo, W, Sc, Y, La, and Ce in a solid-solution or stoichiometric ratio.

5. The BLM stack according to claim 1, further including:
   an intermetallic layer disposed between the metallization and the electrically conductive bump.

6. The BLM stack according to claim 1, wherein the electrically conductive bump includes a tin-lead solder composition.

7. The BLM stack according to claim 1, wherein the electrically conductive bump includes a tin-lead solder composition selected from Sn37Pb, Sn97Pb, and $Sn_xPb_y$, wherein x+y total 1 and wherein x is in a range from about 0.3 to about 0.99.

8. A ball-limiting metallurgy (BLM) stack comprising:
   a refractory metal first layer disposed above and on a metallization;
   a metal second layer disposed above and on the refractory metal first layer, wherein the metal second layer is selected from Al, doped Ti, Ti, TiW, Hf, and Zr;
   a refractory metal upper layer disposed over the metal second layer; and
   an electrically conductive bump disposed above and on the refractory metal upper layer, wherein the refractory metal upper layer is selected from a nitrided refractory metal, a nitrided metal-doped refractory metal, or a nitrided refractory metal alloy selected from Ni, Co, Pd, Pt, NiV, CoV, PdV, PtV, Ti, Zr, Hf, Cr, Mo, W, Sc, Y, La, and Ce in a solid-solution or stoichiometric ratio.

9. A ball-limiting metallurgy (BLM) stack comprising:
   a refractory metal first layer disposed above and on a metallization;

a metal second layer disposed above and on the refractory metal first layer, wherein the metal second layer is selected from Al, doped Ti, Ti, TiW, Hf, and Zr;

a refractory metal upper layer disposed over the metal second layer; and an electrically conductive bump disposed above and on the refractory metal upper layer, wherein the refractory metal upper layer includes a nitrided refractory metal, a nitrided metal-doped refractory metal, or a nitrided refractory metal alloy selected from Ni, Co, Pd, Pt, NiV, CoV, PdV, PtV, Ti, Zr, Hf, Cr, Mo, W, Sc, Y, La, and Ce in a solid-solution or stoichiometric ratio.

10. A ball-limiting metallurgy (BLM) stack comprising:

a refractory metal first layer disposed over a metallization, wherein the refractory metal first layer is in a thickness range from about 500 to 2,000 length units;

a refractory metal second layer disposed above and on the refractory metal first layer, wherein the refractory metal second layer is selected from Al, doped Ti, Ti, TiW, Hf, and Zr, and is in a thickness range from about from about 1,000 to about 4,000 of said length units;

a refractory metal upper layer disposed over the refractory metal second layer, wherein the refractory metal upper layer is in a thickness range from about from about 1,000 to about 4,000 of said length units;

an electrically conductive bump disposed above and on the refractory metal upper layer; and a refractory metal third layer disposed above and on the refractory metal second layer, wherein the refractory metal third layer is in a thickness range from about 500 of said length units, and wherein the refractory metal third layer is substantially the same composition as the refractory metal first layer.

11. The BLM stack according to claim 10, further including:

an intermetallic layer disposed between the metallization and the electrically conductive bump, wherein the intermetallic layer includes a Sn-refractory metal composition.

12. A ball-limiting metallurgy (BLM) stack comprising:

a refractory metal first layer disposed over a metallization, wherein the refractory metal first layer is in a thickness range from about 500 to 2,000 length units;

a refractory metal second layer disposed above and on the refractory metal first layer, wherein the refractory metal second layer is selected from Al, doped Ti, Ti, TiW, Hf, and Zr, and is in a thickness range from about from about 1,000 to about 4,000 of said length units;

a refractory metal upper layer disposed over the refractory metal second layer, wherein the refractory metal upper layer is in a thickness range from about from about 1,000 to about 4,000 of said length units;

an electrically conductive bump disposed above and on the refractory metal upper layer; and a refractory metal third layer disposed above and on the refractory metal second layer, wherein the refractory metal first and third layers include Ti.

13. A ball-limiting metallurgy (BLM) stack comprising:

a refractory metal first layer disposed over a metallization, wherein the refractory metal first layer is in a thickness range from about 500 to 2,000 length units;

a refractory metal second layer disposed above and on the refractory metal first layer, wherein the refractory metal second layer is selected from Al, doped Ti, Ti, TiW, Hf, and Zr, and is in a thickness range from about from about 1,000 to about 4,000 of said length units;

a refractory metal upper layer disposed over the refractory metal second layer, wherein the refractory metal upper layer is in a thickness range from about from about 1,000 to about 4,000 of said length units; and an electrically conductive bump disposed above and on the refractory metal upper layer; and a refractory metal third layer disposed above and on the refractory metal second layer, wherein the refractory metal first and third layers include Ti and the refractory metal first and third layers include a thickness of about 1,000 length units.

14. A ball-limiting metallurgy (BLM) stack comprising:

a refractory metal first layer disposed over a metallization, wherein the refractory metal first layer is in a thickness range from about 500 to 2,000 length units;

a refractory metal second layer disposed above and on the refractory metal first layer, wherein the refractory metal second layer is selected from Al, doped Ti, Ti, TiW, Hf, and Zr, and is in a thickness range from about from about 1,000 to about 4,000 of said length units;

a refractory metal third layer disposed above and on the refractory metal second layer, a refractory metal upper layer disposed over the refractory metal second layer, wherein the refractory metal upper layer is in a thickness range from about from about 1,000 to about 4,000 of said length units wherein the refractory metal upper layer is a refractory metal fourth layer;

an electrically conductive bump disposed above and on the refractory metal upper layer; and wherein the refractory metal first and third layers include Ti and the refractory metal first and third layers each include a thickness of about 1,000 Å, and wherein the refractory metal second and fourth layers each include a thickness of about 2,000 Å.

15. A process comprising:

forming a metallization;

forming a refractory metal first layer above and on the metallization;

forming a refractory metal second layer above and on the refractory metal first layer, wherein the refractory metal second layer is selected from Al, doped Ti, Ti, TiW, Zr, and Hf; and forming a refractory metal upper layer over the refractory metal second layer forming a refractory metal third layer above and on the refractory metal second layer, wherein the refractory metal third layer is substantially the same metal as the refractory metal first layer.

16. The process according to claim 15, further including:

forming an electrically conductive bump above and on the refractory metal upper layer.

17. The process according to claim 15, wherein forming a refractory metal first layer is carried out by physical vapor deposition of Ti.

18. The process according to claim 15, wherein forming a refractory metal first layer over the metal layer over the metallization includes:

sputtering Ti over the metallization to a thickness in a range from about 500 Å to about 2,000 Å.

19. The process according to claim 15, wherein forming a refractory metal second layer over the refractory metal first layer includes:
sputtering doped Ti, or Ti, or TiW over the refractory metal first layer to a thickness in a range from about 1,000 Å to about 2,000 Å.

20. A process comprising:
forming a metallization;
forming a refractory metal first layer above and on the metallization;
forming a refractory metal second layer above and on the refractory metal first layer, wherein the refractory metal second layer is selected from Al, doped Ti, Ti, TiW, Zr, and Hf; and
forming a refractory metal upper layer over the refractory metal second layer wherein forming a refractory metal second layer is carried out by physical vapor deposition of Al.

21. A process comprising:
forming a metallization;
forming a refractory metal first layer above and on the metallization;
forming a refractory metal second layer above and on the refractory metal first layer, wherein the refractory metal second layer is selected from Al, doped Ti, Ti, TiW, Zr, and Hf; and
forming a refractory metal upper layer over the refractory metal second layer wherein forming a refractory metal upper layer is carried out by physical vapor deposition of a NiV composition.

22. A process comprising:
forming a metallization;
forming a refractory metal first layer above and on the metallization;
forming a refractory metal second layer above and on the refractory metal first layer, wherein the refractory metal second layer is selected from Al, doped Ti, Ti, TiW, Zr, and Hf; and
forming a refractory metal upper layer over the refractory metal second layer wherein forming a refractory metal second layer over the refractory metal first layer includes:
sputtering Al over the refractory metal first layer to a thickness in a range from about 1,000 Å to about 2,000 Å.

23. A process comprising:
forming a metallization;
forming a refractory metal first layer above and on the metallization;
forming a refractory metal second layer above and on the refractory metal first layer, wherein the refractory metal second layer is selected from Al, doped Ti, Ti, TiW, Zr, and Hf; and
forming a refractory metal upper layer over the refractory metal second layer wherein forming a refractory metal second layer over the refractory metal first layer includes:
sputtering Zr or Hf over the refractory metal first layer to a thickness in a range from about 1,000 Å to about 2,000 Å.

24. A process comprising:
forming a metallization;
forming a refractory metal first layer above and on the metallization;
forming a refractory metal second layer above and on the refractory metal first layer, wherein the refractory metal second layer is selected from Al, doped Ti, Ti, TiW, Zr, and Hf; and forming a refractory metal upper layer over the refractory metal second layer, wherein forming a refractory metal third layer over the metallization includes:
sputtering Ti over the refractory metal second layer to a thickness in a range from about 500 Å to about 2,000 Å.

25. A process comprising:
forming a metallization;
forming a refractory metal first layer above and on the metallization;
forming a refractory metal second layer above and on the refractory metal first layer, wherein the refractory metal second layer is selected from Al, doped Ti, Ti, TiW, Zr, and Hf; and
forming a refractory metal upper layer over the refractory metal second layer wherein forming a refractory metal upper layer includes:
sputtering NiV to a thickness in a range from about 1,000 Å to about 4,000 Å.

* * * * *